US012730128B2

(12) United States Patent
Inuma et al.

(10) Patent No.: US 12,730,128 B2
(45) Date of Patent: Sep. 8, 2026

(54) MEASUREMENT UNIT

(71) Applicant: NHK Spring Co., Ltd., Yokohama (JP)

(72) Inventors: Tsuyoshi Inuma, Kanagawa (JP); Hiroshi Nakayama, Kanagawa (JP); Shuji Takahashi, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 0 days.

(21) Appl. No.: 18/666,102

(22) Filed: May 16, 2024

(65) Prior Publication Data

US 2024/0302409 A1 Sep. 12, 2024

Related U.S. Application Data

(62) Division of application No. 17/547,400, filed on Dec. 10, 2021, now abandoned.

(30) Foreign Application Priority Data

Dec. 17, 2020 (JP) ................................ 2020-209745

(51) Int. Cl.
*G01R 1/067* (2006.01)
*G01R 1/073* (2006.01)
*H01B 11/18* (2006.01)

(52) U.S. Cl.
CPC ..... *G01R 1/06722* (2013.01); *G01R 1/06733* (2013.01); *G01R 1/073* (2013.01); *H01B 11/1895* (2013.01)

(58) Field of Classification Search
CPC ............ G01R 1/06722; G01R 1/06733; G01R 1/073; H01B 11/1895
See application file for complete search history.

(56) References Cited

U.S. PATENT DOCUMENTS 4,669,805 A * 6/1987 Kosugi .................. H01R 24/52 333/260
6,039,580 A 3/2000 Sciarretta et al.
(Continued)

FOREIGN PATENT DOCUMENTS

CN 1466687 A 1/2004
CN 102055082 A 5/2011
(Continued)

OTHER PUBLICATIONS

Office Action dated Feb. 28, 2025, issued in the corresponding Chinese patent application No. 202111541661.1 and English translation of the cover page and the search report.
(Continued)

*Primary Examiner* — Paresh Patel
(74) *Attorney, Agent, or Firm* — Troutman Pepper Locke LLP

(57) ABSTRACT

A measurement unit includes: a ground portion forming a part of a line configured to provide continuity for grounding electric potential, the ground portion including a surface forming a plane at one end of the ground portion; a signal portion forming a part of a line configured to provide continuity for a signal for measurement, the signal portion including an end portion configured to come out in a plane that is same as the plane of the ground portion; an insulative dielectric portion provided between the ground portion and the signal portion; an electrically conductive first contact probe configured to expand and contract along a longitudinal axis, the first contact probe coming into contact with the signal portion; and an electrically conductive second contact probe configured to expand and contract along a longitudinal axis, the second contact probe coming into contact with the ground portion.

11 Claims, 7 Drawing Sheets

(56) References Cited

U.S. PATENT DOCUMENTS 6,079,986 A * 6/2000 Beshears ................ H01R 12/52 439/63
6,113,397 A * 9/2000 Myers .................... H01R 24/52 439/63
6,459,274 B1 * 10/2002 Singer .................... G01R 31/69 324/543
6,515,499 B1 2/2003 Parrish et al.
7,252,555 B2 * 8/2007 Moessinger ............. H01R 9/05 439/700
7,510,436 B2 * 3/2009 Peng ...................... H01R 27/02 324/756.05
7,740,508 B2 * 6/2010 Feldman ............ G01R 31/2889 324/755.02
9,645,172 B2 5/2017 Santos et al.
RE46,936 E * 7/2018 Vinther .................. H01R 43/00
RE47,459 E 6/2019 Vinther et al.
10,931,040 B1 2/2021 Diaz et al.
2001/0017549 A1 8/2001 Inoue et al.
2002/0195265 A1 12/2002 Miller et al.
2003/0117129 A1 6/2003 Parrish
2003/0122538 A1 7/2003 Parrish et al.
2004/0038586 A1 * 2/2004 Hall ....................... H01R 24/40 439/578
2005/0208828 A1 9/2005 Miller et al.
2005/0212541 A1 9/2005 Ruff et al.
2005/0277331 A1 * 12/2005 Hall ..................... H01R 24/542 439/578
2014/0199885 A1 7/2014 Vinther et al.
2015/0280372 A1 * 10/2015 Huang ................... H01R 24/40 439/581
2016/0164219 A1 * 6/2016 Philip .................. H01R 13/523 439/587
2022/0011345 A1 1/2022 Inuma et al.
2025/0233352 A1 * 7/2025 Sura ................... H01R 13/5219

FOREIGN PATENT DOCUMENTS

| | | | |
|---|---|---|---|
| CN | 103884882 | A | 6/2014 |
| CN | 104025393 | A | 9/2014 |
| JP | S60-123666 | U | 8/1985 |
| JP | H01-145575 | A | 6/1989 |
| JP | H05-060789 | A | 3/1993 |
| JP | 2005-311525 | A | 11/2005 |
| JP | 2010-032531 | A | 2/2010 |
| JP | 4678993 | B2 | 4/2011 |
| JP | 2013-224912 | A | 10/2013 |
| JP | 6756946 | B1 | 9/2020 |
| TW | 201617622 | A | 5/2016 |
| TW | 201619614 | A | 6/2016 |
| TW | M358968 | U | 6/2019 |
| WO | 2010117058 | A1 | 10/2010 |

OTHER PUBLICATIONS

Office Action dated Jun. 27, 2022, issued for the Taiwan patent application No. 110146973 and an English translation thereof.

Office Action dated Jan. 23, 2024, issued for JP2020-209745 and English machine translation thereof.

Office Action dated Feb. 6, 2024, issued for KR10-2021-0177987 and English machine translation tereof.

English translation of TW M358968 UI (Year: 2009).

* cited by examiner 5
5
71
5a
73
72
5a
74
72
73
74
(a)
(b)

5A
5A
71A
5b
73
72
5b
72
73
74A
(a)
(b)

MEASUREMENT UNIT

This application is based upon and claims the benefit of priority from Japanese Patent Application No. 2020-209745, filed on Dec. 17, 2020, the entire contents of which are incorporated herein by reference.

BACKGROUND

The present disclosure relates to a measurement unit.

For inspecting continuity states or operating characteristics of targets to be inspected, such as semiconductor integrated circuits or liquid crystal panels, a cable to be connected to an inspection device and a connecting member to be connected to an opposite end portion of the cable have been used, the opposite end portion being opposite to an end portion of the cable, the end portion being near the inspection device (see, for example, Japanese Patent No. 4678993). The cable has a signal conductor in the center, a dielectric that covers the signal conductor, and a ground conductor that covers the dielectric. The connecting member has a central contact to be connected to the signal conductor and a side contact to contact the ground conductor.

SUMMARY

The opposite end portion of the cable in the configuration described in Japanese Patent No. 4678993 is cut diagonally to be connected to the connecting member. The transmission line changes from a coaxial line to a so-called coplanar line at this connected portion and this line change tends to generate noise.

There is a need for a measurement unit that enables reduction in noise.

According to one aspect pf the present disclosure, there is provided a measurement unit including: a ground portion forming a part of a line configured to provide continuity for grounding electric potential, the ground portion including a surface at one end of the ground portion, the surface forming a plane; a signal portion forming a part of a line configured to provide continuity for a signal for measurement, the signal portion including an end portion configured to come out in a plane that is same as the plane of the ground portion; a dielectric portion provided between the ground portion and the signal portion, the dielectric portion being insulative; a first contact probe configured to expand and contract along a longitudinal axis, the first contact probe being electrically conductive and coming into contact with the signal portion; and a second contact probe configured to expand and contract along a longitudinal axis, the second contact probe being electrically conductive and coming into contact with the ground portion.

DETAILED DESCRIPTION

A mode for implementing the present disclosure (hereinafter, referred to as an "embodiment") will hereinafter be described by reference to the appended drawings. The drawings are schematic, a relation between a thickness and a width of each portion and ratios among thicknesses of respective portions may be different from the actual relation and ratios, and the drawings may also include a portion that differs in its dimensional relations or ratios among the drawings.

Figure 1:
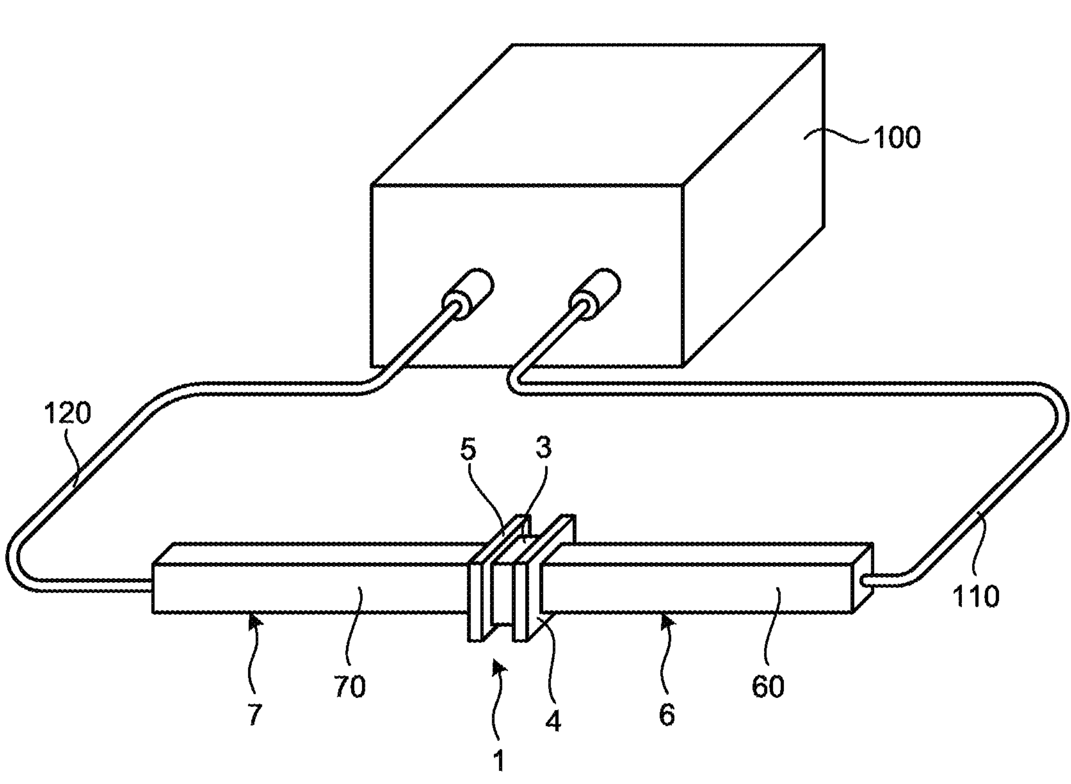
FIG. 1 is a diagram illustrating a configuration of a measurement system according to an embodiment.
Figure 2:
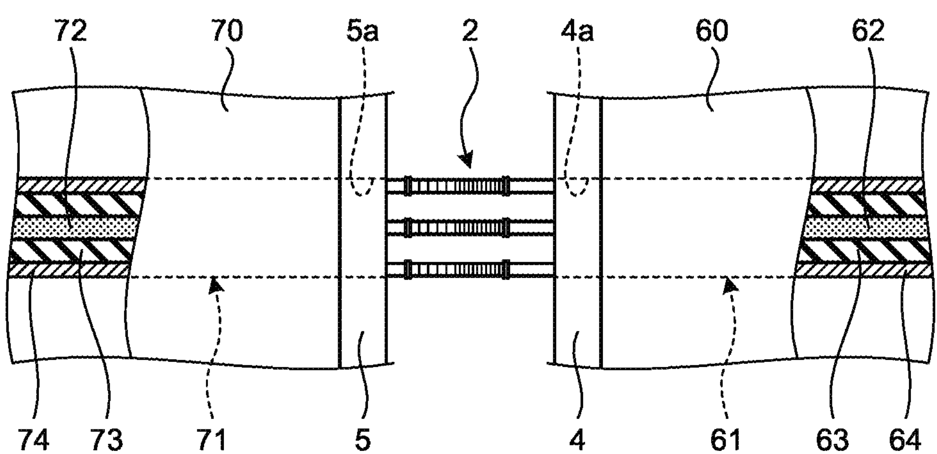
FIG. 2 is a diagram illustrating a configuration of a part of the measurement system illustrated in FIG. 1.

FIG. 1 is a diagram illustrating a configuration of a measurement system according to an embodiment. FIG. 2 is a diagram illustrating a configuration of a part of the measurement system illustrated in FIG. 1. FIG. 2 illustrates a configuration in a measurement unit 1 and excluding a probe holder 3 described later. The measurement system includes the measurement unit 1, a measurement device 100 that inputs and outputs signals from and to a measurement target, and connecting cables 110 and 120 that connect the measurement unit 1 and the measurement device 100 to each other.

The measurement unit 1 includes contact probes 2 (hereinafter, simply referred to as "probes 2"), the probe holder 3 that holds the probes 2, a first ground plate 4, a second ground plate 5, a first coaxial line portion 6, and a second coaxial line portion 7.

Figure 3:
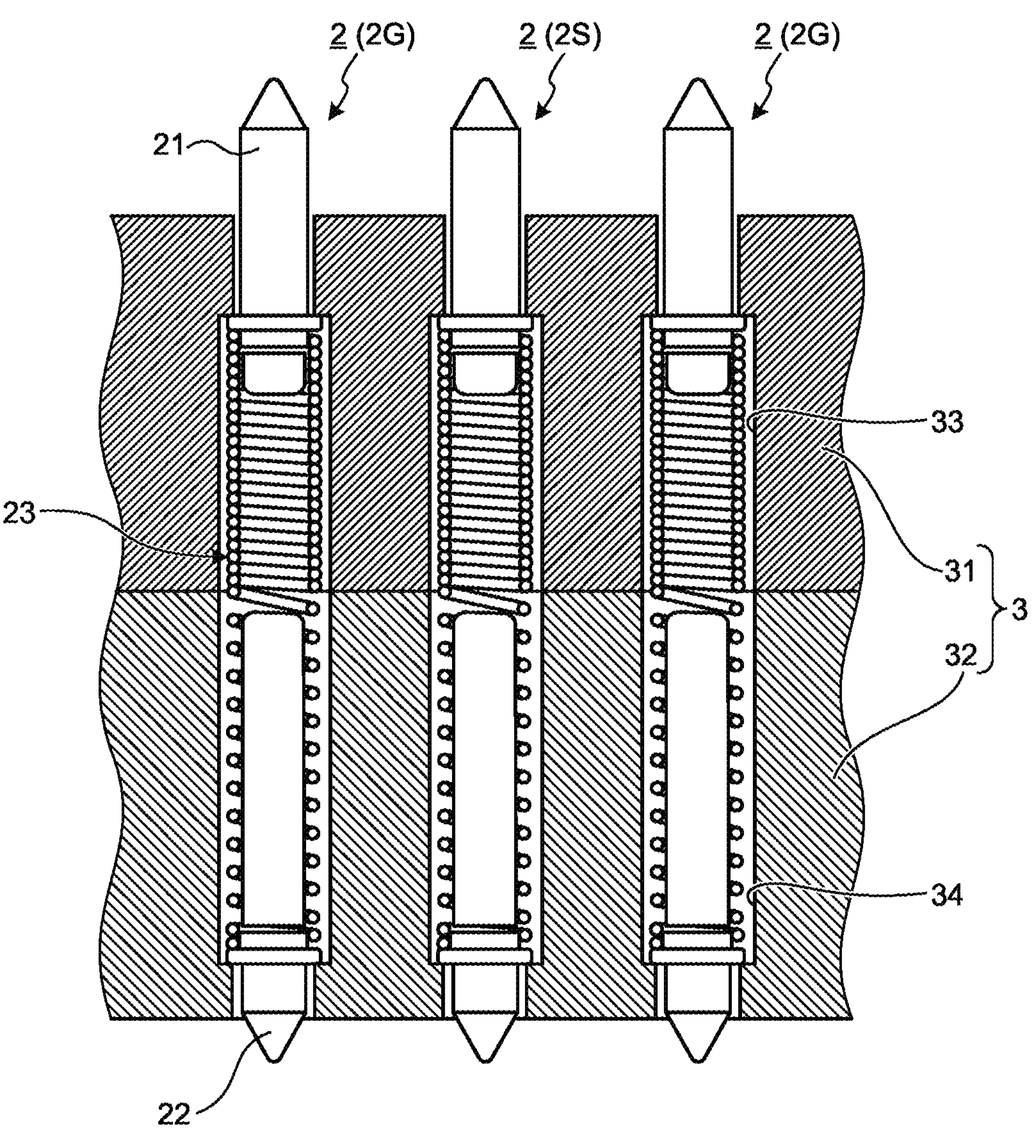
FIG. 3 is a diagram illustrating a detailed configuration of probes held in a probe holder.

FIG. 3 is a diagram illustrating a detailed configuration of probes held in a probe holder. The probes 2 have electric conductivity and are connected to the first ground plate 4 and the second ground plate 5 at both ends of their longitudinal lengths. The probes 2 are formed using an electrically conductive material, and each include a first plunger 21 to contact the first ground plate 4, a second plunger 22 to contact the second ground plate 5, and a coil spring 23 that is provided between the first plunger 21 and the second plunger 22 and couples the first plunger 21 and the second plunger 22 together to enable the probe 2 to expand and contract. The first plunger 21 and second plunger 22 and the coil spring 23 that form the probe 2, share the same axis.

The probe holder 3 is formed using an insulating material, such as resin, machinable ceramic, or silicone, and is formed of a first member 31 positioned higher in FIG. 3 and a second member 32 positioned lower in FIG. 3 that are layered over each other. The first member 31 and the second member 32 have the same number of holder holes 33 or 34 respectively formed therein for holding the plural probes 2, and the holder holes 33 and 34 to hold the probes 2 are formed such that the axes of the holder holes 33 and 34 are aligned with each other. Positions at which the holder holes 33 and 34 are formed are determined according to a layout pattern of the probes 2.

When the probe holder 3 is placed between the first ground plate 4 and the second ground plate 5, the coil spring 23 is brought into a state of being compressed along a longitudinal direction by contact loads from these ground plates.

Figure 4:
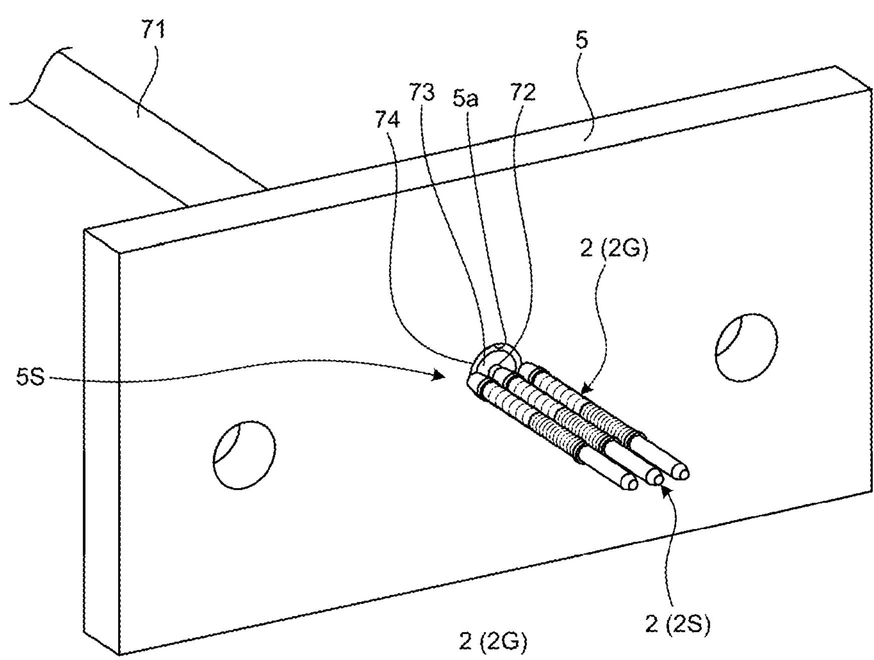
FIG. 4 is a diagram illustrating a mode of connection between the probes and a ground plate.
Figure 5:
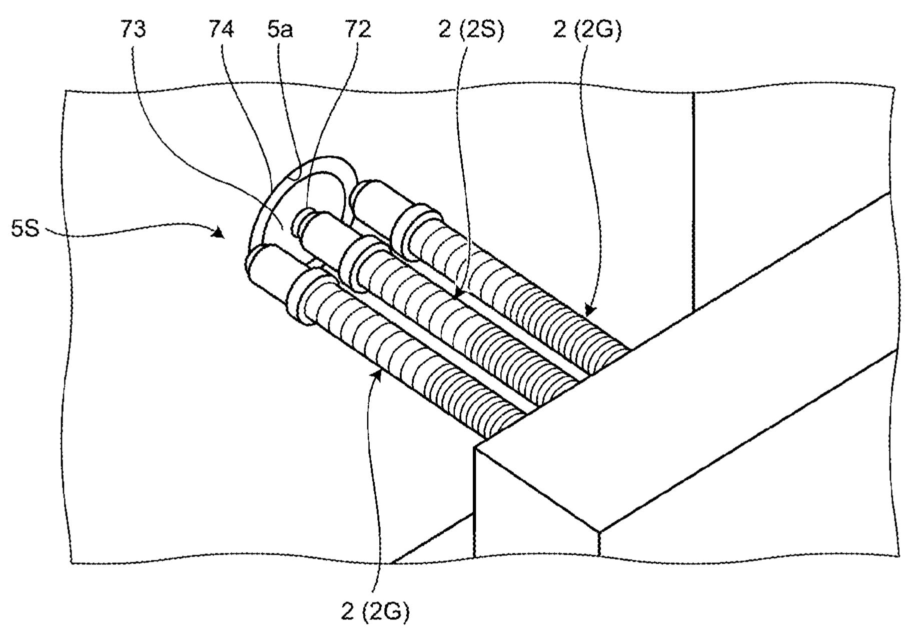
FIG. 5 is an enlarged view of a part of FIG. 4.
Figure 6:
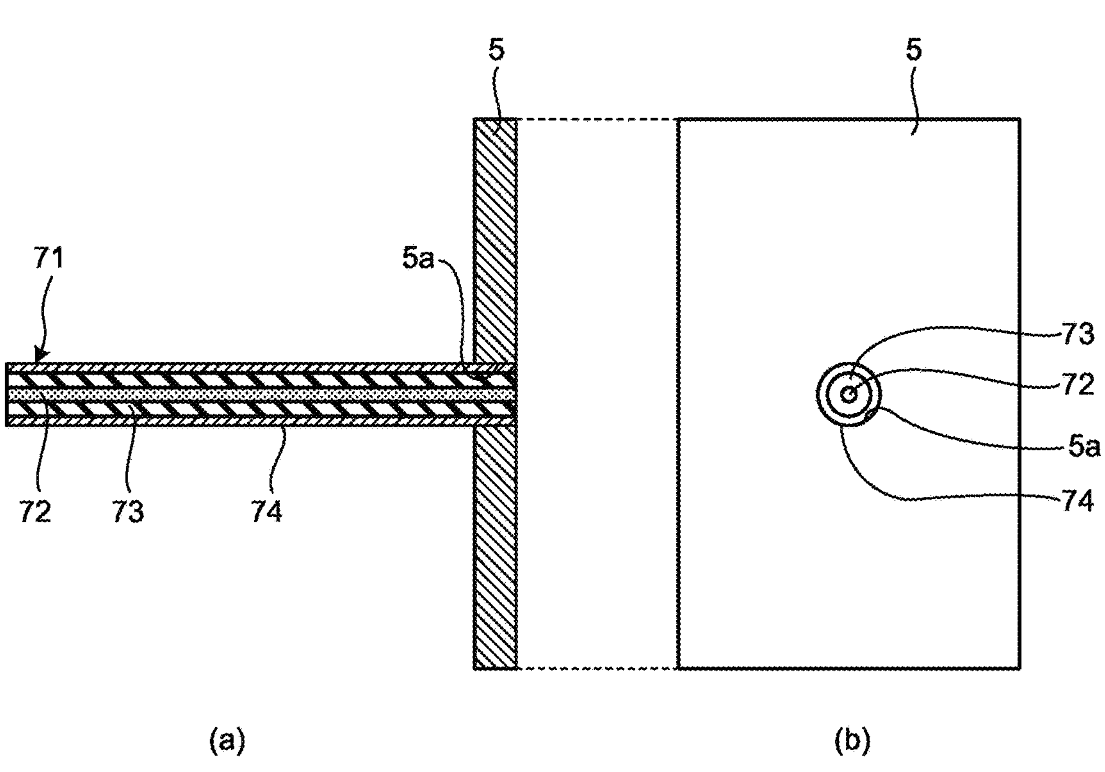
FIG. 6 is a diagram illustrating a configuration of the ground plate and a coaxial cable.

A mode of connection between the probes 2 and the first ground plate 4 and second ground plate 5 will be described next. FIG. 4 is a diagram illustrating a mode of connection between probes and a ground plate. FIG. 5 is an enlarged view of a part of FIG. 4. FIG. 6 is a diagram illustrating a configuration of the ground plate and a coaxial cable. In FIG. 6, (a) is a sectional view of a configuration having the second ground plate 5 and a coaxial cable 71 connected to each other. In FIG. 6, (b) is a plan view of the second ground plate 5 as viewed from a side opposite to a side to which the coaxial cable 71 is connected. FIG. 6 illustrates the connection between the second ground plate 5 and the coaxial cable 71, but connection between the first ground plate 4 and a coaxial cable 61 has a similar configuration.

The first ground plate 4 is formed using an electrically conductive material and is plate-shaped. The first ground plate 4 has, formed therein, a through hole 4*a* penetrating the first ground plate 4 in its plate thickness direction (see FIG. 2). The through hole 4*a* is a hole extending with a diameter that is approximately equivalent to a diameter of the outer circumference of the coaxial cable 61 described later. Being approximately equivalent includes being identical and having a slight difference due to manufacturing errors.

The second ground plate 5 is formed using an electrically conductive material and is plate-shaped. The second ground plate 5 has, formed therein, a through hole 5*a* penetrating the second ground plate 5 in its plate thickness direction. The through hole 5*a* is a hole extending with a diameter that is approximately equivalent to a diameter of the outer circumference of the coaxial cable 71 described later.

The first ground plate 4 and the second ground plate 5 are made of copper, nickel, or stainless steel, for example. The first ground plate 4 and the second ground plate 5 may be formed of a material that is the same as a material that forms ground conductors 64 and 74 described later.

The first coaxial line portion 6 includes the coaxial cable 61. The coaxial cable 61 is held by a cable holding member 60. Furthermore, an opposite end portion of the coaxial cable 61 is inserted in the through hole 4*a* of the first ground plate 4, the opposite end portion being opposite to an end of the coaxial cable 61, the end being connected to the connecting cable 110. The coaxial cable 61 may be press-fitted in the through hole 4*a*, fixed by soldering, for example, or fixed by a combination of these press fitting and soldering.

The coaxial cable 61 has a signal conductor 62 that transmits a signal from the measurement device 100, a dielectric 63 that is provided around the signal conductor 62 and is insulating, and the ground conductor 64 provided around the dielectric 63 (see FIG. 2). The signal conductor 62, the dielectric 63, and the ground conductor 64 form a coaxial structure. The dielectric 63 and the ground conductor 64 are each tubular. The ground conductor 64 is made of copper, nickel, or stainless steel, for example. The coaxial cable 61 thus has a configuration that is the same as that of a so-called semi-rigid cable. In this embodiment, a signal conductor forms a signal portion and a dielectric forms a dielectric portion.

An end portion of the coaxial cable 61 is exposed from the through hole 4*a* at a surface of the first ground plate 4, the end portion being near the first ground plate 4. An end face of the coaxial cable 61 and the surface of the first ground plate 4 are thus positioned in the same plane, the surface being on a side of the first ground plate 4, the side being where the end face of the coaxial cable 61 comes out. Furthermore, the first ground plate 4 forms a ground portion by being electrically connected to the ground conductor 64. The ground portion forms a part of a line that provides continuity for grounding electric potential.

The second coaxial line portion 7 includes the coaxial cable 71. The coaxial cable 71 is held by a cable holding member 70. Furthermore, an opposite end portion of the coaxial cable 71 is inserted in the through hole 5*a* of the second ground plate 5, the opposite end portion being opposite to an end of the coaxial cable 71, the end being connected to the connecting cable 120. The coaxial cable 71 may be press-fitted in the through hole 5*a*, fixed by soldering, for example, or fixed by a combination of these press fitting and soldering.

The coaxial cable 71 has a signal conductor 72 that transmits a signal from the measurement device 100, a dielectric 73 that is provided around the signal conductor 72, and the ground conductor 74 provided around the dielectric 73. The signal conductor 72, the dielectric 73, and the ground conductor 74 form a coaxial structure. The dielectric 73 and the ground conductor 74 are each tubular. The ground conductor 74 is made of copper, nickel, or stainless steel, for example. The coaxial cable 71 thus has a configuration that is the same as that of a so-called semi-rigid cable.

An end portion of the coaxial cable 71 is exposed from the through hole 5*a* at a planar surface (5S) of the second ground plate 5, the end portion being near the second ground plate 5. An end face of the coaxial cable 71 and the planar surface (5S) of the second ground plate 5 are thus positioned in the same plane, the surface being on a side of the second ground plate 5, the side being where the end face of the coaxial cable 71 comes out. Furthermore, the second ground plate 5 forms a ground portion as described above by being electrically connected to the ground conductor 74.

In this embodiment, each of the coaxial cables 61 and 71 comes into contact with three probes 2. The first ground plate 4 and the coaxial cable 61 form a first connecting portion and the second ground plate 5 and the coaxial cable 71 form a second connecting portion. The measurement system may include at least one of the first and second connecting portions, and any other publicly known mode of connection may be adopted for the other one of the first and second connecting portions.

One end (the first plunger 21 herein) of each of the probes 2 comes into contact with any one of the signal conductor 62 and the ground conductor 64, at the end portion of the coaxial cable 61, the end portion coming out from the first ground plate 4. In FIG. 4 and FIG. 5, one of the probes 2 comes into contact with the signal conductor 62 and the other two of the probes 2 come into contact with the ground conductor 64. As to the coaxial cable 71, similarly, the probe 2 that comes into contact with the signal conductor 62 comes into contact with the signal conductor 72, and the other two probes 2 that come into contact with the ground conductor 64 come into contact with the ground conductor 74. Central axes of the coaxial cables 61 and 71 and central axes of the probes 2 are thus either aligned with each other or extend parallel to each other, in their longitudinal directions.

In the drawings, the probe 2 (a first contact probe) that comes into contact with the signal conductors 62 and 72 is illustrated as a probe 2S and the probes 2 (second contact probes) that come into contact with the ground conductors 64 and 74 are illustrated as probes 2G. Parts with which the probes 2G come into contact may be a surface of the first ground plate 4 and a surface of the second ground plate 5, without being limited to the ground conductors 64 and 74.

The minimum pitch between the probes 2 is a radius of the inner circumference of a ground conductor. For example, in a case where the probes 2 are caused to contact a central portion of the ground conductor at an end face of a coaxial cable, the pitch between the probes is determined by (diameter of outer circumference of ground conductor+diameter of inner circumference of ground conductor)÷2÷2.

According to the above described embodiment, an end face of a signal conductor of a coaxial cable and an end face of a ground portion formed of a ground conductor and a ground plate are positioned in the same plane, and plural probes are brought into contact with the signal conductor and the ground portion to achieve continuity for a signal line and a ground line. This embodiment enables a coaxial line to be maintained and thus unchanged in form, contrary to the conventional configuration, and as a result, enables reduction in noise.

Furthermore, because the plural probes 2 to be connected to a coaxial cable are individually provided in the above described embodiment, the pitch between the probes 2 and the number and layout of the probes 2G to be connected to a ground portion are able to be freely set. Therefore, the measurement unit 1 is able to be used for various types of measurement without being limited by the mode of connection.

A configuration using a single coaxial cable has been described above with respect to the embodiment, but a configuration including a ground plate that is provided with plural through holes and holds plural coaxial cables may be adopted instead.

Figure 7:
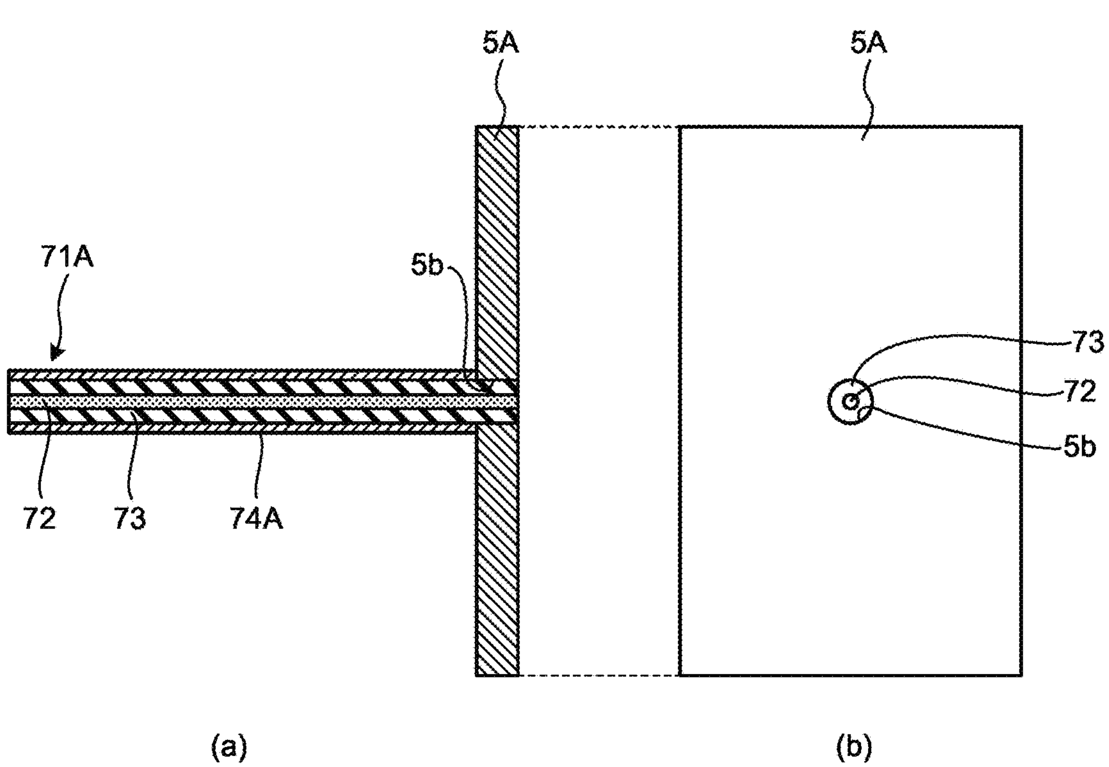
FIG. 7 is a diagram illustrating a configuration of a ground plate and a coaxial cable, according to a first modified example.

FIG. 7 is a diagram illustrating a configuration of a ground plate and a coaxial cable, according to a first modified example. In FIG. 7, (a) is sectional view of a configuration having a second ground plate and a coaxial cable connected to each other. In FIG. 7, (b) is a plan view of the second ground plate as viewed from an opposite side of the second ground plate, the opposite side being opposite to a side of the second ground plate, the side being where the coaxial cable is connected. A measurement unit according to this first modified example has, provided therein, a second ground plate 5A instead of the second ground plate 5 described above, and a coaxial cable 71A instead of the coaxial cable 71. Description of any configuration that is the same as that of the embodiment described above will hereinafter be omitted.

The coaxial cable 71A has a signal conductor 72, a dielectric 73, and a ground conductor 74A that is provided around the dielectric 73. The signal conductor 72, the dielectric 73, and the ground conductor 74A form a coaxial structure. The ground conductor 74A is made of copper, nickel, or stainless steel, for example. The coaxial cable 71A thus has a configuration that is the same as that of a so-called semi-rigid cable.

At an end portion of the ground conductor 74A, the ground conductor 74A is shorter than the signal conductor 72 and the dielectric 73 by a length corresponding to a thickness of the second ground plate 5A, the end portion being at an end of the ground conductor 74A, the end being connected to the second ground plate 5A. Therefore, the outer periphery of the dielectric 73 is exposed at the end portion of the ground conductor 74A, the end portion being at the end to be connected to the second ground plate 5A.

The second ground plate 5A is formed using an electrically conductive material and is plate-shaped. The second ground plate 5A has, formed therein, a through hole **5*b* penetrating the second ground plate 5A in its plate thickness direction. The through hole 5*b* is a hole extending with a diameter that is approximately equivalent to a diameter of the outer circumference of the dielectric 73**.

The coaxial cable 71A is connected to the second ground plate 5A by insertion of the dielectric 73 into the through hole **5*b*. The dielectric 73 of the coaxial cable 71A may be press-fitted into the through hole 5*b*, the dielectric 73 may be fixed to the second ground plate 5A by soldering, for example, or the coaxial cable 71A may be fixed by a combination of these press-fitting and soldering. Upon the press-fitting and/or soldering, the ground conductor 74A comes into contact with a surface of the second ground plate 5A. The second ground plate 5A and the ground conductor 74A are thereby electrically connected to each other. The ground conductor 74A and the second ground plate 5A** may be fixed to each other by soldering, for example, to be electrically connected to each other.

End portions of the signal conductor 72 and dielectric 73 of the coaxial cable 71A are exposed from the through hole **5*b* at a surface of the second ground plate 5A. End faces of the signal conductor 72 and dielectric 73 and the surface of the second ground plate 5A are thus positioned in the same plane, the surface being on a side of the second ground plate 5A, the side being where an end face of the coaxial cable 71A** comes out.

The probe 2S comes into contact with the signal conductor 72 that comes out from the through hole **5*b*. The probes 2G, on the other hand, come into contact with the surface of the second ground plate 5A**.

In the above described first modified example also, an end face of a signal conductor of a coaxial cable and an end face of a ground portion formed of a ground conductor and a ground plate are positioned in the same plane, and plural probes are brought into contact with the signal conductor and the ground portion to achieve continuity for a signal line and a ground line. This first modified example enables a coaxial line to be maintained and thus unchanged in form, contrary to the conventional configuration, and as a result, enables reduction in noise. Furthermore, similarly to the embodiment, the first modified example enables the freedom of the layout of the probes 2 to be increased and is thus able to be adapted to various types of measurement.

Figure 8:
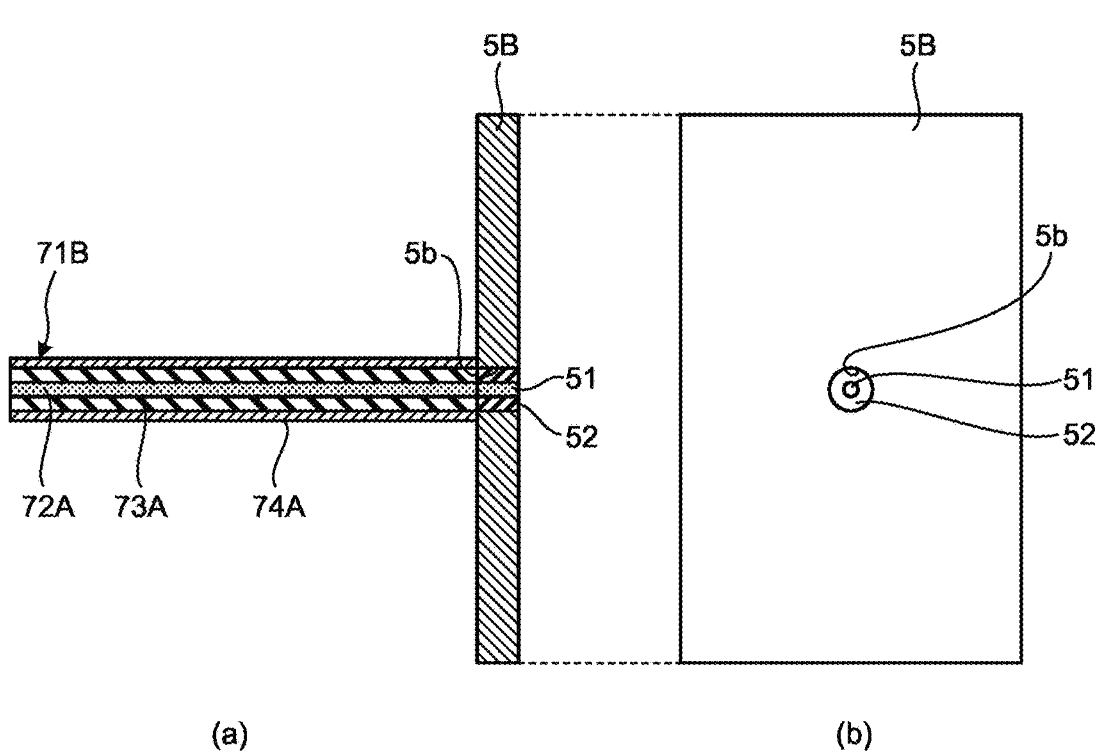
FIG. 8 is a diagram illustrating a configuration of a ground plate and a coaxial cable, according to a second modified example.

FIG. 8 is a diagram illustrating a configuration of a ground plate and a coaxial cable, according to a second modified example. In FIG. 8, (a) is a sectional view of a configuration having a second ground plate and a coaxial cable connected to each other. In FIG. 8, (b) is a plan view of the second ground plate as viewed from a side opposite to a side to which the coaxial cable is connected. A measurement unit according to this second modified example, has, provided therein, a second ground plate 5B instead of the second ground plate 5 described above, and a coaxial cable 71B instead of the coaxial cable 71. Description of any configuration that is the same as that of the embodiment described above will hereinafter be omitted.

The coaxial cable 71B has a first signal conductor 72A (a signal conductor) that transmits a signal from the measurement device 100, a first dielectric 73A (a cable dielectric) provided around the first signal conductor 72A, and a ground conductor 74A provided around the first dielectric 73A. The first signal conductor 72A, the first dielectric 73A, and the ground conductor 74A form a coaxial structure, and their end faces are positioned in the same plane, the end faces being at their ends to be connected to the second ground plate 5B.

The second ground plate 5B is formed using an electrically conductive material and is plate-shaped. The second ground plate 5B has a second signal conductor 51 (a signal relaying portion) and a second dielectric 52 (a ground plate dielectric) covering the outer periphery of the second signal conductor 51. In this second modified example, the first signal conductor 72A and the second signal conductor 51 form a signal portion and the first dielectric 73A and the second dielectric 52 form a dielectric portion.

The second ground plate 5B has, formed therein, a through hole 5*b* penetrating the second ground plate 5B in its plate thickness direction. The through hole 5*b* is a hole extending with a diameter that is approximately equivalent to a diameter of the outer circumference of the second dielectric 52. The second dielectric 52 of the second signal conductor 51 and second dielectric 52 is fixed in the through hole 5*b*. Upon the fixing, end faces of the second signal conductor 51 and second dielectric 52 are positioned in the same plane as a surface of the main body of the second ground plate 5B.

The second signal conductor 51 and the first signal conductor 72A preferably have the same diameter. Furthermore, the second dielectric 52 and the first dielectric 73A preferably have the same diameter. In addition, the first dielectric 73A and the second dielectric 52 may be formed using the same material, or may be formed using materials different from each other.

The coaxial cable 71B is connected to the second ground plate 5B by being fixed in a state where the first signal conductor 72A has been brought into contact with the second signal conductor 51. Upon this connection, the ground conductor 74A comes into contact with a surface of the second ground plate 5B. The second ground plate 5B and the ground conductor 74A are thereby electrically connected to each other. The first signal conductor 72A and the second signal conductor 51 may be electrically connected to each other by being fixed to each other by soldering, for example. Furthermore, the second ground plate 5B and the ground conductor 74A may be electrically connected to each other by being fixed to each other by soldering, for example.

Furthermore, the probe 2S comes into contact with an opposite end of the second signal conductor 51 to be electrically connected thereto, the opposite end being opposite to an end of the second signal conductor 51, the end being an end with which the first signal conductor 72A comes into contact. The probes 2G come into contact with an opposite surface of surfaces of the second ground plate 5B to be electrically connected thereto, the opposite surface being opposite to the surface with which the ground conductor 74A comes into contact.

In the above described second modified example also, an end face of a signal conductor of a coaxial cable and an end face of a ground portion formed of a ground conductor and a ground plate are positioned in the same plane, and plural probes are brought into contact with the signal conductor and the ground portion to achieve continuity for a signal line and a ground line. This second modified example enables a coaxial line to be maintained and thus unchanged in form, contrary to the conventional configuration, and as a result, enables reduction in noise. Furthermore, similarly to the embodiment, the second modified example enables the freedom of the layout of the probes 2 to be increased and is thus able to be adapted to various types of measurement.

Figure 9:
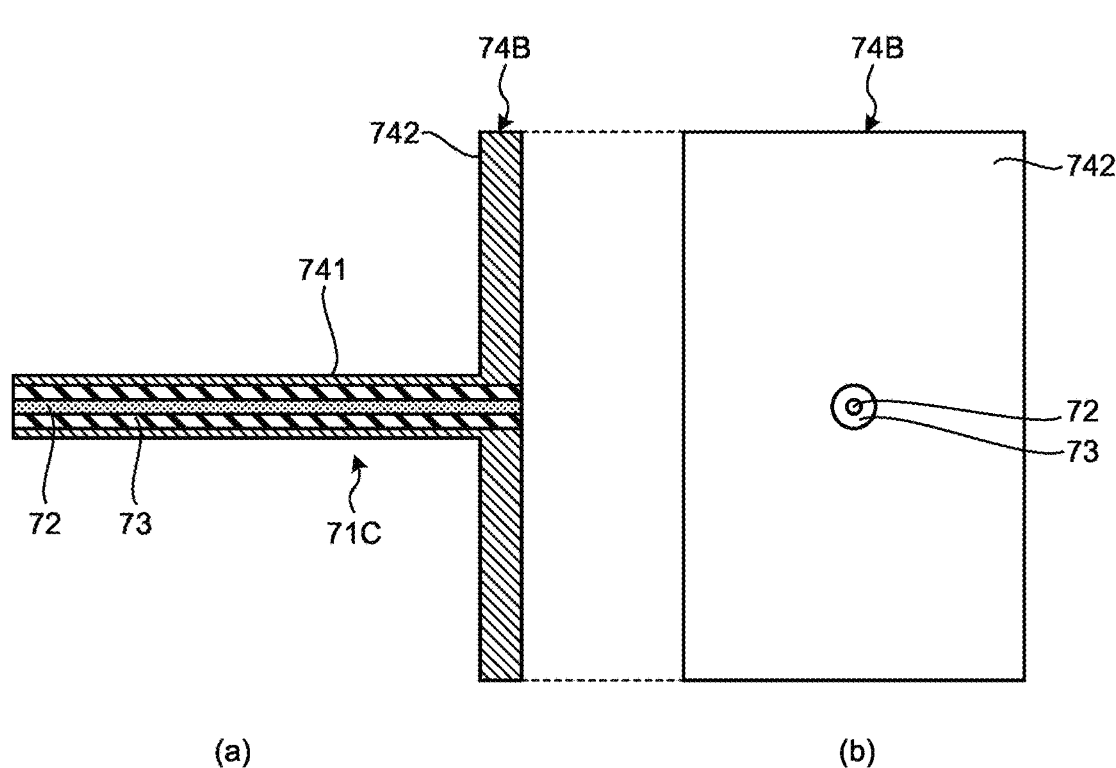
FIG. 9 is a diagram illustrating a configuration of a coaxial cable according to a third modified example.

FIG. 9 is a diagram illustrating a configuration of a coaxial cable according to a third modified example. In FIG. 9, (a) is a sectional view of the coaxial cable. In FIG. 9, (b) is a plan view of the coaxial cable. A measurement unit according to this third modified example does not have the second ground plate 5 described above, and is provided with a coaxial cable 71C instead of the coaxial cable 71. Description of any configuration that is the same as that of the embodiment described above will be omitted.

The coaxial cable 71C has the signal conductor 72 and dielectric 73 described above, and a ground conductor 74B covering the outer periphery of the dielectric 73. The signal conductor 72, the dielectric 73, and the ground conductor 74B form a coaxial structure.

The ground conductor 74B has a tubular portion 741 extending along a longitudinal direction of the coaxial cable 71C (the dielectric 73), and a flat plate portion 742 that is provided at an end portion of the tubular portion 741 and is tabular. End faces of the signal conductor 72 and dielectric 73 are thus positioned in the same plane as a surface of the flat plate portion 742, the end faces being at ends of the signal conductor 72 and dielectric 73, the ends being where the signal conductor 72 and dielectric 73 are exposed on the surface of the flat plate portion 742. In this third modified example, the ground conductor 74B forms a ground portion.

The probe 2S comes into contact with the signal conductor 72 that comes out from the flat plate portion 742. The probes 2G, on the other hand, come into contact with the surface of the flat plate portion 742.

In this third modified example described above also, an end face of a signal conductor of a coaxial cable and a surface of a ground conductor (a flat plate portion) are positioned in the same plane, and plural probes are brought into contact with the signal conductor and the ground conductor to achieve continuity for a signal line and a ground line. This third modified example enables a coaxial line to be maintained and thus unchanged in form, contrary to the conventional configuration, and as a result, enables reduction in noise. Furthermore, similarly to the embodiment, the third modified example enables the freedom of the layout of the probes 2 to be increased and is thus able to be adapted to various types of measurement.

FOURTH MODIFIED EXAMPLE

Figure 10:
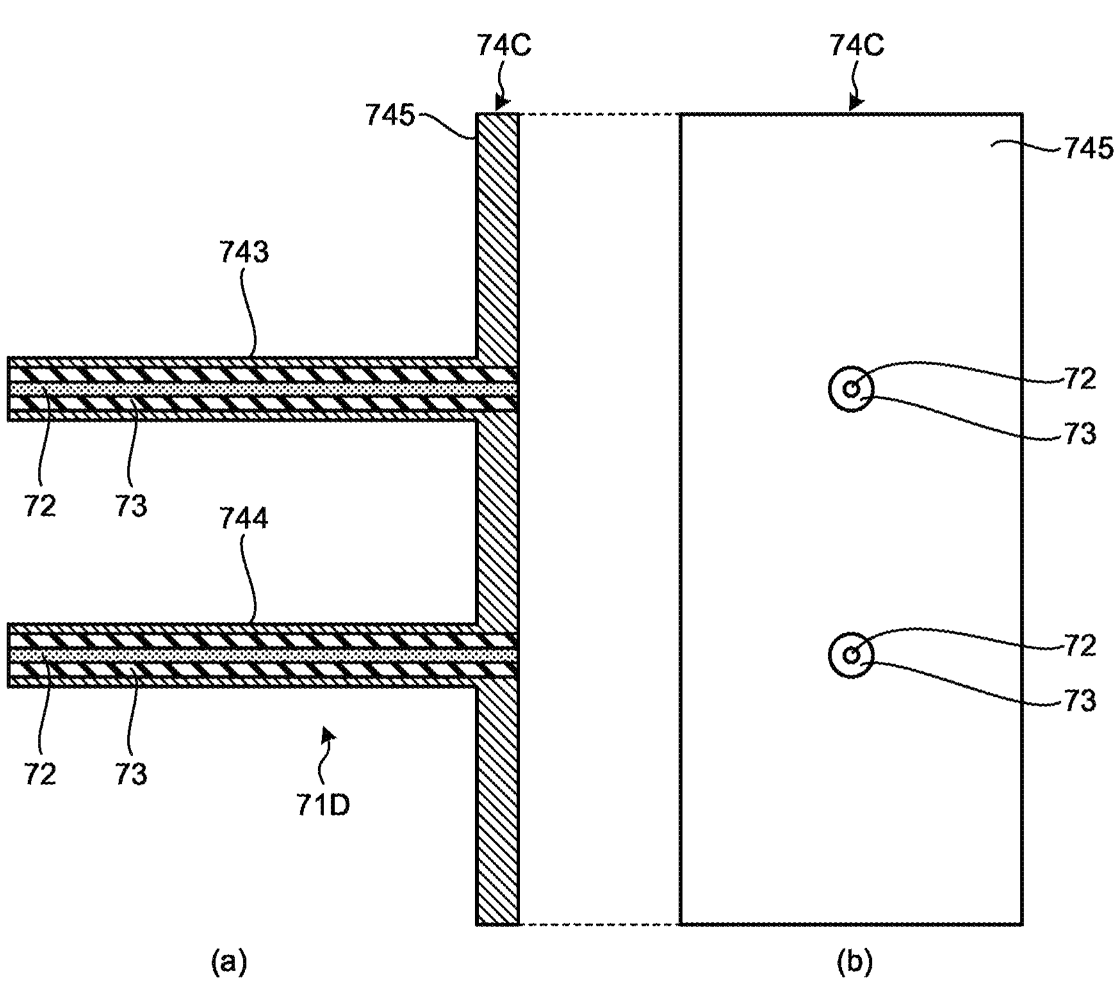
FIG. 10 is a diagram illustrating a configuration of a coaxial cable according to a fourth modified example.

FIG. 10 is a diagram illustrating a configuration of a coaxial cable according to a fourth modified example. In FIG. 10, (a) is a sectional view of the coaxial cable. In FIG. 10, (b) is a plan view of the coaxial cable. A measurement unit according to this fourth modified example does not have the second ground plate 5 described above, and is provided with a coaxial cable 71D instead of the coaxial cable 71. Description of any configuration that is the same as that of the embodiment described above will be omitted.

The coaxial cable 71D has the signal conductors 72 and the dielectrics 73 described above, and a ground conductor 74C covering the outer peripheries of the dielectrics 73.

The ground conductor 74C has a first tubular portion 743 that covers the dielectric 73, a second tubular portion 744 that covers the dielectric 73 different from the dielectric 73 covered by the first tubular portion 743, and a flat plate portion 745 that is provided at an end portion of the first tubular portion 743 and second tubular portion 744 and is tabular. End faces of the signal conductors 72 and the dielectrics 73 and a surface of the flat plate portion 745 are positioned in the same plane, the end faces being at ends of the signal conductors 72 and the dielectrics 73, the ends being where the signal conductors 72 and the dielectrics 73 are exposed on the surface of the flat plate portion 745.

Figure 11:
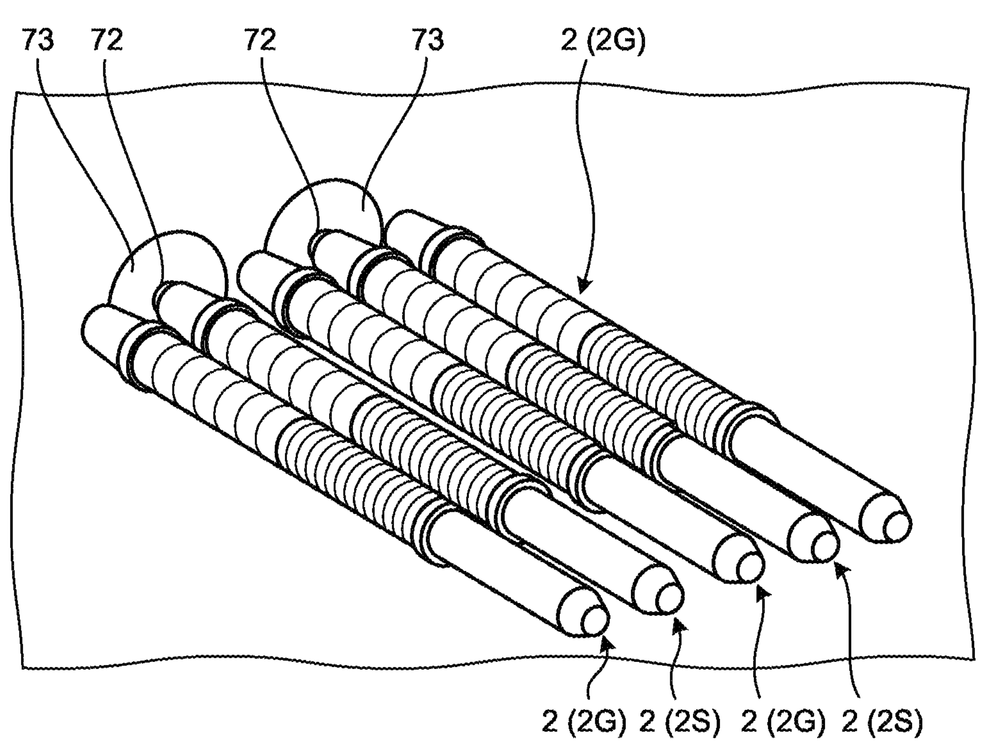
FIG. 11 is a perspective view illustrating an example of a mode of contact between the coaxial cable and probes, according to the fourth modified example.

In this fourth modified example, two probes 2S and three probes 2G are provided. FIG. 11 is a perspective view illustrating an example of a mode of contact between the coaxial cable and probes, according to the fourth modified example. One of the probes 2S comes into contact with one of the signal conductors 72 that come out from the flat plate portion 745. The other one of the probes 2S comes into contact with the other one of the signal conductors 72 that come out from the flat plate portion 745. Furthermore, one of the probes 2G is positioned between (inward from) the probes 2S and comes into contact with the surface of the flat plate portion 745. The remaining two of the probes 2G are each positioned outward from the two probes 2S and come into contact with the surface of the flat plate portion 745.

The layout and number of the probes 2G are not limited to the layout and number provided in FIG. 11, and various modifications are possible. For example, a configuration without the probe 2G provided between the two probes 2S may be adopted instead.

In this fourth modified example described above also, an end face of a signal conductor of a coaxial cable and a surface of a ground conductor (a flat plate portion) are positioned in the same plane, and plural probes are brought into contact with the signal conductor and the ground conductor to achieve continuity for a signal line and a ground line. This fourth modified example enables a coaxial line to be maintained and thus unchanged in form, contrary to the conventional configuration, and as a result, enables reduction in noise. Furthermore, similarly to the embodiment, the fourth modified example enables the freedom of the layout of the probes 2 to be increased and is thus able to be adapted to various types of measurement.

With respect to the first to fourth modified examples, a configuration including a second ground plate and a coaxial cable connected to the second ground plate and a configuration without the second ground plate have been described above, but the first to fourth modified examples are also applicable to a configuration including a first ground plate and a coaxial cable connected to the first ground plate and any one of the above described configurations may be adopted for the mode of connection between the probes 2 and the coaxial cable. For such connection, the same configurations may be combined together or configurations different from each other may be combined together.

A mode for implementing the present disclosure has been described thus far, but the present disclosure is not to be limited only to the above described embodiment. For example, a ground plate may be configured to have an insulating portion as long as continuity is achieved between the probes 2G and the ground plate.

The configuration of contact probes described herein is just an example, and various types of probes conventionally known may be used. For example, without being limited to the above described configuration having plungers and a coil spring, probes to be used may each be: a probe including a pipe member; a pogo pin; a solid electrically conductive member; an electrically conductive pipe; a wire; or a connecting terminal (a connector) that connects electric contact points together, or any combination of these different types of probes may be adopted as appropriate.

The measurement unit is suitable for reducing noise, as described above.

The present disclosure has an effect of enabling reduction in noise.

Additional advantages and modifications will readily occur to those skilled in the art. Therefore, the disclosure in its broader aspects is not limited to the specific details and representative embodiments shown and described herein. Accordingly, various modifications may be made without departing from the spirit or scope of the general concept as defined by the appended claims and their equivalents.

What is claimed is:

1. A measurement unit comprising:

a ground portion forming a part of a line configured to provide continuity for grounding electric potential, the ground portion including a surface at one end of the ground portion, the surface forming a plane;

a signal portion forming a part of a line configured to provide continuity for a signal for measurement, the signal portion including an end portion configured to come out in a plane that is same as the plane of the ground portion;

a dielectric portion provided between the ground portion and the signal portion, the dielectric portion being insulative;

a first contact probe configured to expand and contract along a longitudinal axis, the first contact probe being electrically conductive and coming into contact with the signal portion;

a second contact probe configured to expand and contract along a longitudinal axis, the second contact probe being electrically conductive and coming into contact with the ground portion;

a first connecting portion including one set of the ground portion, the signal portion, and the dielectric, a surface of the first connecting portion being flat; and a second connecting portion including another set of the ground portion, the signal portion, and the dielectric and provided opposite to the first connecting portion, a surface of the second connecting portion being flat, wherein one end of each of the first and second contact probes comes into contact with the surface of the first connecting portion and the other end of each of the first and second contact probes comes into contact with the surface of the second connecting portion.

2. The measurement unit according to claim 1, further comprising:

a ground plate; and a coaxial cable connected to the ground plate, wherein the coaxial cable comprises:

a signal conductor forming the part of the line of the signal portion;

a dielectric provided around the signal conductor; and a ground conductor provided around the dielectric, the signal conductor forms the signal portion, the dielectric forms the dielectric portion, and the ground conductor and the ground plate form the ground portion.

3. The measurement unit according to claim 2, wherein the ground plate includes a through hole formed in the ground plate, and the ground conductor is inserted into the through hole.

4. The measurement unit according to claim 3, wherein a plurality of the coaxial cables are connected to the ground plate.

5. The measurement unit according to claim 2, wherein the ground plate includes a through hole formed in the ground plate, the dielectric is inserted into the through hole, and the ground conductor is electrically connected to a surface of the ground plate.

6. The measurement unit according to claim 5, wherein a plurality of the coaxial cables are connected to the ground plate.

7. The measurement unit according to claim 2, wherein a plurality of the coaxial cables are connected to the ground plate.

8. The measurement unit according to claim 1, further comprising:

a ground plate; and a coaxial cable connected to the ground plate, wherein the ground plate comprises:

a signal relaying portion forming the part of the line of the signal portion; and a ground plate dielectric configured to cover an outer periphery of the signal relaying portion, the coaxial cable comprises:

a signal conductor forming the part of the line of the signal portion and electrically connected to the signal relaying portion;

a cable dielectric provided around the signal conductor; and a ground conductor provided around the cable dielectric and electrically connected at a position different from positions of the signal relaying portion and ground plate dielectric of the ground plate, wherein the signal relaying portion and the signal conductor form the signal portion, the ground plate dielectric and the cable dielectric form the dielectric portion, and the ground conductor and the ground plate form the ground portion.

9. The measurement unit according to claim 8, wherein a plurality of the coaxial cables are connected to the ground plate.

10. The measurement unit according to claim 1, further comprising:

a coaxial cable including:

a signal conductor forming the line of the signal portion;

a dielectric provided around the signal conductor and forming the dielectric portion; and a ground conductor provided around the dielectric and forms the ground portion, wherein the ground conductor comprises:

a tubular portion extending along the signal conductor and the dielectric; and a flat plate portion provided at an end portion of the tubular portion, the flat plate portion being tabular, and end faces of the signal conductor and the dielectric are positioned in a same plane as a surface of the flat plate portion.

11. The measurement unit according to claim 10, further comprising a plurality of groups each including the signal conductor, the dielectric, and the tubular portion.

* * * * *